United States Patent
Lee et al.

(10) Patent No.: US 6,265,315 B1
(45) Date of Patent: *Jul. 24, 2001

(54) METHOD FOR IMPROVING CHEMICAL/MECHANICAL POLISH UNIFORMITY OVER ROUGH TOPOGRAPHY FOR SEMICONDUCTOR INTEGRATED CIRCUITS

(75) Inventors: Yu-Hua Lee, Hsinchu; James (Cheng-Ming) Wu, Kao-Hsiung, both of (TW)

(73) Assignee: Taiwan Semiconductor Manufacturing Company, Hsin-Chu (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/104,030

(22) Filed: Jun. 24, 1998

(51) Int. Cl.[7] ................................................. H01L 21/302
(52) U.S. Cl. .......................... 438/692; 438/624; 438/626; 438/634; 438/697; 438/760
(58) Field of Search ........................................ 438/626, 634, 438/692, 697, 624, 631, 633, 698, 699, 760, 763

(56) References Cited

U.S. PATENT DOCUMENTS

| | | | |
|---|---|---|---|
| 4,946,550 | * 8/1990 | Van Laarhoven | 438/631 |
| 5,312,512 | * 5/1994 | Allman et al. | 438/624 |
| 5,332,467 | 7/1994 | Sune et al. | 156/636 |
| 5,399,533 | 3/1995 | Pramanik et al. | 437/228 |
| 5,403,780 | * 4/1995 | Jain et al. | 438/634 |
| 5,459,096 | 10/1995 | Venkatesan et al. | 437/67 |
| 5,482,894 | * 1/1996 | Havemann | 438/623 |
| 5,532,191 | 7/1996 | Nakano et al. | 437/228 |
| 5,540,811 | 7/1996 | Morita | 156/636.1 |
| 5,573,633 | * 11/1996 | Gambino et al. | 438/533 |
| 5,679,211 | * 10/1997 | Huang | 438/697 |
| 5,686,337 | * 11/1997 | Koh et al. | 438/240 |
| 5,759,906 | * 6/1998 | Lou | 438/626 |
| 5,780,338 | * 7/1998 | Jeng et al. | 438/253 |
| 5,814,564 | * 9/1998 | Yao et al. | 438/723 |
| 5,963,837 | * 10/1999 | Ilg et al. | 438/760 |

* cited by examiner

*Primary Examiner*—Stephen D. Meier
*Assistant Examiner*—Maria Guerrero
(74) *Attorney, Agent, or Firm*—George O. Saile; Stephen B. Ackerman

(57) ABSTRACT

A method for making a planar interlevel dielectric (ILD) layer, having improved thickness uniforming across the substrate surface, over a patterned electrically conducting layer is achieved. The method involves forming electrically conducting lines on which is deposited a conformal first insulating layer that is uniformly thick across the substrate. An etch-stop composed of $Si_3N_4$ is deposited and a second insulating layer, composed of $SiO_2$ or a low-dielectric-constant insulator, is deposited. The second insulating layer is then partially chemically/mechanically polished back to within a few thousand Angstroms of the etch-stop layer. The remaining second insulating layer is then plasma etched back selectively to the etch-stop layer to form a planar surface having a uniformly thick first insulating layer over the electrically conducting lines. The contact openings or via holes can now etched to a uniform depth in the etch-stop layer and the first insulating layer across the substrate. This results in contact openings having a constant aspect ratio across the substrate, thereby resulting in more repeatable and reliable contact resistance ($R_c$).

28 Claims, 2 Drawing Sheets

METHOD FOR IMPROVING CHEMICAL/MECHANICAL POLISH UNIFORMITY OVER ROUGH TOPOGRAPHY FOR SEMICONDUCTOR INTEGRATED CIRCUITS

BACKGROUND OF THE INVENTION (1) Field of the Invention

The present invention relates generally to fabricating integrated circuits on semiconductor substrates, and more specifically to a method for making planar interlevel dielectric (ILD) layers with improved uniformity across the substrate using an improved chemical/mechanical polishing and etch-back technique. This method results in a more uniform ILD layer over the rough metal topography, thereby allowing the etching of contact openings or via holes to a uniform depth for improved contact resistance control.

(2) Description of the Prior Art

As the circuit density on Ultra Large Scale Integration (ULSI) circuits increases, it becomes necessary to increase the number of metal interconnecting levels to effectively wire up the discrete semiconductor devices on the semiconductor chips. In the conventional method, the different levels of metal interconnections are separated by insulating layers, commonly referred to as interlevel dielectric (ILD) layers. Via holes or contact holes are etched in the ILD layers to connect one level of metal to the next, or to make electrical contacts to the underlying polysilicon or polycide lines. These multilevels of metal interconnections generally lead to a rough topography. This makes it difficult to form the patterned photoresist layers having high-resolution, distortion-free images over this rough topography, and is due to the shallow depth of focus (DOF) necessary for exposing the photoresist. Also anisotropic plasma etching (directional etching) is used in conjunction with these photoresist masks to pattern the electrically conducting layers to achieve the closely spaced metal lines having high aspect ratios. Therefore it is difficult to pattern the metal over the rough topography without leaving residue that can cause intralevel electrical shorts. This problem becomes more severe as the circuit density increases and the minimum feature sizes are further reduced in size.

Therefore, it is common practice in the semiconductor industry to use planarizing techniques for leveling the ILD layers over the patterned metal layers to eliminate the rough topography. Several methods of planarizing the ILD layers include using a low-flow-temperature glass such as borophosphosilicate glass (BPSG), which is reflowed. Another method is to deposit a spin-on glass (SOG) which is then cured to provide a planar $SiO_2$ layer. Other methods of planarizing are to deposit a photo-resist layer and etching back the photoresist layer and the ILD layer using a plasma etch having a 1:1 etch-rate selectivity. However, because of loading effects during etching which are area dependent it is difficult to maintain a 1:1 etch-rate ratio.

More recently, chemical/mechanical polishing (CMP), which provides a global planarization across the substrate, has attracted much interest in the industry. This CMP is achieved in a polishing tool using a polishing pad and a polishing slurry containing an abrasive material (e.g., alumina or silica). During polishing a chemical etchant is generally introduced to remove material from the wafer by both chemical and mechanical means. However, there are several drawbacks to CMP. For example, one of the drawbacks is that it is difficult to control the polishing uniformity across the substrate. This large variation in ILD thickness across the substrate makes it difficult to reliably etch submicron contact openings or via holes in the ILD layer at the different chip (die) locations across the wafer. This variation in thickness results in contacts or vias having large differences in aspect ratio (height/width of opening). This difference in aspect ratio results in large variations in contact resistance ($R_c$) across the wafer from die to die, and makes it difficult to control the tolerance of the electrical design parameters.

Several methods for planarizing an insulating layer over patterned metal layers have been reported. For example, Nakano et al., U.S. Pat. No. 5,532,191, describe a method for forming a planar silicon oxide by chemical/mechanical polishing. A conformal silicon oxide layer is deposited over the metal lines and a thinner insulating layer having a slower polishing rate is deposited. The convex portions of a conformal silicon oxide layer over the metal lines is polished to the thinner insulating layer in the concave portions between the metal lines, as shown in FIGS. 1A–1D of Nakano's patent, and the polishing is stopped to provide a planar surface. Another method for forming planar insulation-filled trenches in a silicon substrate is described by Venkatesan et al., U.S. Pat. No. 5,459,096. The trenches are filled with a conformal dielectric layer which is then patterned. A thin second planarization layer is deposited, and the structure is chemical/mechanically polished back to the second planarizing layer resulting in a planar trench-filled structure. Sune et al. in U.S. Pat. No. 5,332,467 utilize polishing-stop islands formed in the recesses of the rough surface. An insulating layer is deposited and polished back to the polishing-stop islands to provide a planar surface. Pramanik et al. in U.S. Pat. No. 5,399,533 describe a method for planarizing a spin-on glass layer using an underlying silicon nitride etch-stop layer, and Morita in U.S. Pat. No. 5,540,811 planarizes an insulating layer by depositing a silicon nitride polish-back stop layer. The silicon nitride layer is patterned to leave portions in the concave areas, and then the insulating layer is polished back to the polish-back stop layer to provide a planar surface.

However, there is still a current need for providing a more planar interlevel dielectric (ILD) layer on integrated circuits that allows contact openings or via holes to be etched more controllably to a constant etch depth across the substrate.

SUMMARY OF THE INVENTION

It is therefore a principal object by a first embodiment of the present invention to provide a novel CMP/etch-back method for planarizing an interlevel dielectric (ILD) layer with improved ILD thickness over the underlying metal topography across the semiconductor substrate.

It is another object by a second embodiment of the present invention to provide a novel CMP/etch-back method for planarizing an interlevel dielectric (ILD) layer with improved ILD thickness over the underlying metal topography across the semiconductor substrate, and having a low-dielectric-constant (low-k) insulator in the recesses of the patterned electrically conducting layer.

Still another object of this invention is to provide an etch-stop layer with high etch selectivity to reduce the non-uniformity across the substrate resulting from the chemical/mechanical polishing, thereby providing a more controllable contact or via hole etching tolerance.

A further object of this invention is to provide a simple cost-effective manufacturing process.

In accordance with the objects of this invention, a new method for forming a planar interlevel dielectric (ILD) layer that is uniformly thick across the substrate is described. A semiconductor substrate is provided having a patterned electrically conducting layer, such as polysilicon, polycide, or metal. The patterned conducting layer is used for electrically connecting the devices on the substrate. The method of forming a planar ILD layer over the patterned conducting layer begins by depositing a conformal first insulating layer having a uniform thickness across the wafer. A conformal etch-stop layer, such as silicon nitride ($Si_3N_4$), is then deposited over the first insulating layer. A second insulating layer, composed of silicon oxide ($SiO_2$), as described in a first embodiment, or a low-dielectric-constant insulator, as described in a second embodiment, is deposited to a thickness that is greater than the thickness of the patterned conducting layer. The second insulating layer is then chemically/mechanically polished (CMP) back to within a few thousand Angstroms (1000–2000 Angstroms) of the etch-stop layer. The remaining second insulating layer is then selectively etched back to the etch-stop layer to complete the planar ILD layer. Since the first insulating layer is uniformly thick over the patterned electrically conducting layer and across the substrate, contact openings or via holes can be reliably etched to a uniform depth across the wafer. This allows one to make submicrometer contact openings having uniform aspect ratios, and therefore provides a contact resistance ($R_c$) that is less dependent from die to die (chip to chip) across the substrate.

BRIEF DESCRIPTION OF THE DRAWINGS

The objectives and other advantages of this invention are best understood with reference to the preferred embodiments and drawings in the figures.

DESCRIPTION OF THE PREFERRED EMBODIMENTS

Figure 1:
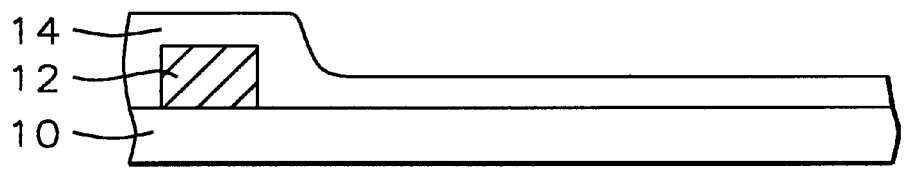
FIGS. 1 through 5 are schematic cross-sectional views showing the sequence of process steps for forming a planar ILD layer with improved thickness uniformity over patterned electrical interconnections across the substrate by the method in a first embodiment.

Referring to FIGS. 1 through 5, the method for forming a planar insulating layer over a rough topography, by the method of a first embodiment, is now described. Referring to FIG. 1, a portion of a semiconductor substrate 10 is shown having a patterned electrically conducting layer 12 on its surface depicting one of the conducting lines 12. Typically the electrically conducting layer is patterned using conventional photolithographic techniques and anisotropic plasma etching. For example, layer 12 can be patterned using reactive ion etching (RIE) or high-density plasma (HDP) etching using an appropriate etchant gas, such as a gas containing a chlorine (Cl) species. The patterned layer 12 is used to form part of the electrical interconnections for semiconductor devices (not shown) in and on the substrate 10. The method for making this improved planar insulating layer is applicable over any patterned conducting layer. For example, layer 12 can be a doped polysilicon layer that is commonly used as part of the semiconductor devices and local interconnections. The polysilicon can be deposited by low pressure chemical vapor deposition (LPCVD) using silane ($SiH_4$) as the reactant gas, and can be doped either in situ or by ion implantation. Alternatively, a refractory metal silicide layer can be deposited on the doped polysilicon layer to form a polycide layer. Also, layer 12 can be a metal layer such as an aluminum/copper (Al/Cu) alloy used for the multilevels of electrical interconnections. Layer 12 is typically deposited to a thickness of between about 1000 and 6000 Angstroms.

Still referring to FIG. 1, the method of forming this improved planar interlevel dielectric (ILD) layer over the patterned conducting layer begins by depositing a conformal first insulating layer 14 having a uniform thickness across the substrate 10. Layer 14, which forms a portion of the ILD layer, is preferably composed of $SiO_2$, and is deposited by LPCVD using tetraethosiloxane/ozone (TEOS/$O_3$) as the reactant gas mixture. Layer 14 is deposited to a thickness of between about 5000 and 10000 Angstroms, and varies in thickness across the substrate by about +/−10 percent.

Figure 2:
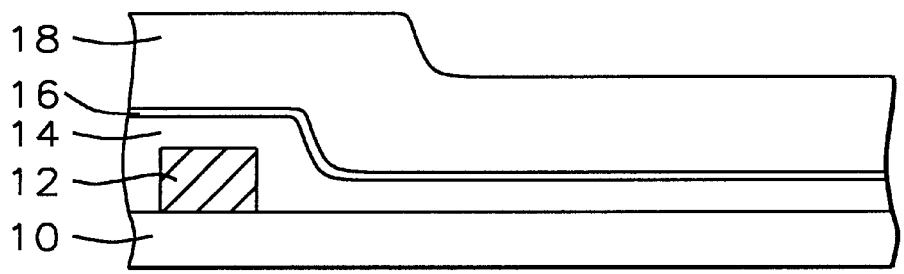

Referring now to FIG. 2, a conformal etch-stop layer 16 is deposited over the first insulating layer 14. Layer 16 is preferably a silicon nitride ($Si_3N_4$) and is deposited by plasma-enhanced (PE) CVD. When the patterned electrically conducting layer 12 is a low-melting-point metal, such as Al or Al/Cu, the $Si_3N_4$ is preferably deposited at a low temperature of about 300–400° C. using PECVD and a reactant gas mixture of $SiH_4$ and ammonia ($NH_3$). Layer 16 is deposited to a preferred thickness of between about 100 and 500 Angstroms.

Still referring to FIG. 2, a second insulating layer 18 composed of silicon oxide ($SiO_2$) is deposited on the etch-stop layer 16. The $SiO_2$ is deposited preferably by PECVD using a reactant gas such as TEOS and oxygen ($O_2$) or TEOS and $O_3$. Layer 18 is deposited to a thickness that is greater than the thickness of the patterned conducting layer 12, and more specifically to a thickness of between about 5000 and 10000 Angstroms.

Figure 3:
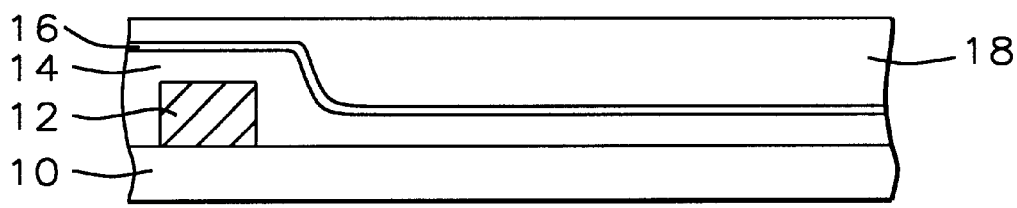

Referring next to FIG. 3, the second insulating layer 18 is chemically/mechanically polished (CMP) back to within a few thousand Angstroms (1000–2000 Angstroms) of the etch-stop layer 16 over the electrically conducting layer 12. The polishing is achieved using a polishing tool and a polishing slurry containing an abrasive such as $SiO_2$.

Figure 4:
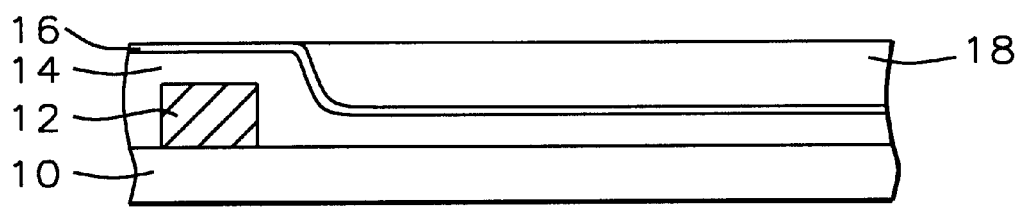

Referring now to FIG. 4, the remaining $SiO_2$ second insulating layer 18 is then selectively etched back to the $Si_3N_4$ etch-stop layer 16 over the electrically conducting layer 12 to complete the planar ILD layer. The etch-rate ratio of the $SiO_2$ layer 18 to the underlying $Si_3N_4$ etch-stop layer is preferably greater than 20:1. This etch-rate selectivity can be achieved using a HDP etcher using an etchant gas such as perfluoroisobutylene/carbon monoxide/argon ($C_4F_8$/CO/Ar). Since the selective etching stops at the $Si_3N_4$ layer 16 over layer 12, the first insulating layer 14 has a uniform thickness (+/−10%) over each of the conducting lines 12 across the substrate.

Figure 5:
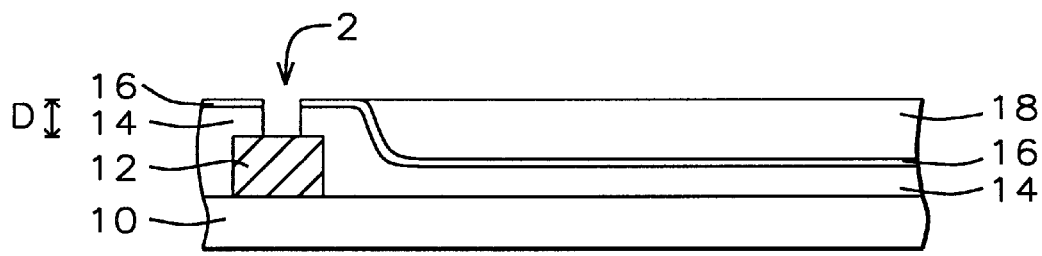

As shown now in FIG. 5, since the first insulating layer 14 is uniformly thick over the patterned electrically conducting layer 12 across the substrate, contact openings or via holes 2 can be reliably etched to a uniform depth D across the wafer. Only one of the multitude of contact openings 2 etched across the wafer is depicted in FIG. 5. This allows one to make submicrometer contact openings having uniform aspect ratios, and therefore provides a contact resistance ($R_c$) that is less dependent from die to die (chip to chip) across the substrate. The contact openings or via holes 2 are etched preferably using anisotropic plasma etching. For example, the etching can be carried out in a HDP etcher using an etchant gas that etches the $SiO_2$ layer 14 selectively to the underlying electrically conducting layer 12. More specifically, the preferred etchant gas is carbon tetrafluoride/ trifluoromethane/argon ($CF_4/CHF_3/Ar$).

Figure 6:
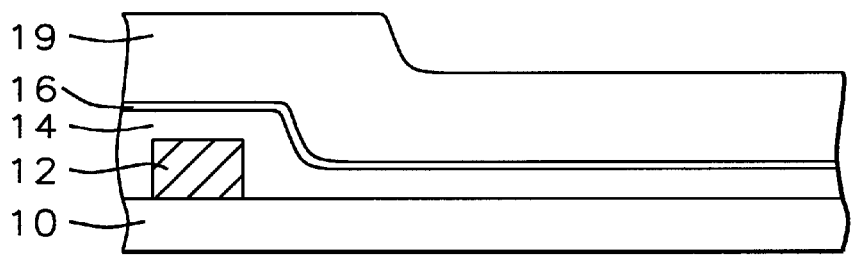
FIGS. 6 through 8 are schematic cross-sectional views showing the sequence of process steps for forming a planar ILD layer with improved thickness uniformity over patterned electrical interconnections across the substrate by the method in a second embodiment.
Figure 7:
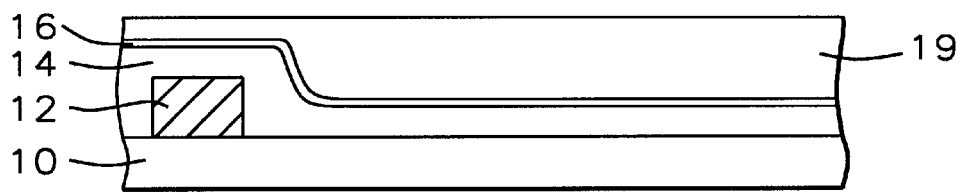
Figure 8:
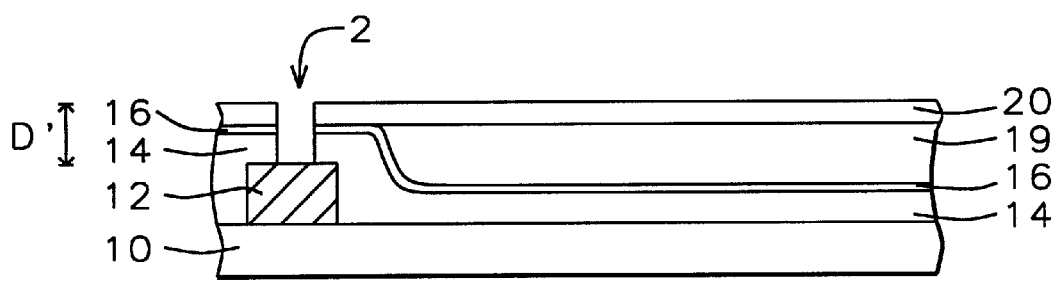

Referring to FIGS. 6 through 8, a second embodiment of the invention is now described. The second embodiment is similar to the first embodiment up to and including the etch-stop layer 16 shown in FIG. 2. In this embodiment the etch-stop layer 16 can also be a plasma-enhanced (PE) CVD silicon oxide, deposited to a preferred thickness of between about 100 and 500 Angstroms. Layer 16 is preferably deposited using a reactant gas such as $TEOS/O_3$. In the second embodiment, the $SiO_2$ second insulating layer 18 is now replaced with a low-dielectric-constant (low-k) insulating layer 19 to improve circuit performance by reducing the capacitance and therefore the $R_C$ time constant. The preferred low-k insulating layer 19 is a low-k polymer designated as FLARE™, manufactured by Allied Signal of U.S.A., and is synthesized from perfluorobiphenyl with aromatic bisphenols, which results in a fluorine-doped polymer having a low-dielectric constant of about 2.7. Layer 19 is preferably deposited in one or more layers using spin coating, and baked at a temperature of between about 100 and 200° C. to cure the polymer and to minimize outgassing. Other low-k materials can also be used as layer 19, such as a fluorosilicate glass (SiOF) deposited by HDP deposition using, for example, silicon tetrafluoride ($SiF_4$) and $O_2$ as the reactant gas mixture to provide a layer having a dielectric constant of about 3.5. Layer 19 is deposited to a thickness that is greater than the thickness of the patterned conducting layer 12, and more specifically to a thickness of between about 5000 and 10000 Angstroms.

Referring next to FIG. 7, the low-k polymer insulating layer 19 is chemically/mechanically polished (CMP) back to within a few thousand Angstroms (1000–2000 Angstroms) of the etch-stop layer 16 over the electrically conducting layer 12. The polishing is achieved using a polishing tool and a polishing slurry containing $SiO_2$.

Referring now to FIG. 8, the remaining low-k polymer insulating layer 19 is then selectively etched back to the $Si_3N_4$ or PECVD oxide etch-stop layer 16 over the electrically conducting layer 12 to complete the planar ILD layer. The etch-rate ratio of the low-k polymer layer 19 to the underlying etch-stop layer 16 is preferably greater than 10:1. This etch-rate selectivity can be achieved using a RIE and using an etchant gas such as $CF_4/CHF_3/Ar$. Since the selective etching stops at the etch-stop layer 16 over layer 12, the first insulating layer 14 has a uniform thickness (+/−10%) over each of the conducting lines 12 across the substrate.

Still referring to FIG. 8, a third insulating layer 20, preferably composed of $SiO_2$, is deposited on the etch-stop layer 16 over the patterned electrically conducting layer 12, and over the low-k polymer insulating layer 19 to protect the next level of electrical interconnections from corrosion. Layer 20 is preferably deposited by a low-temperature (<400° C.) PECVD to a thickness of between about 500 and 1000 Angstroms. Since the first and third insulating layers 14 and 20 are of uniform thickness over the patterned electrically conducting layer 12 across the substrate, contact openings or via holes 2 can be reliably etched to a uniform depth D' across the wafer. Only one of the multitude of contact openings 2 etched across the wafer is depicted in FIG. 8. This allows one to make submicrometer contact openings having uniform aspect ratios, and therefore provides a contact resistance ($R_c$) that is less dependent from die to die (chip to chip) across the substrate. The contact openings or via holes 2 are etched preferably using anisotropic plasma etching. For example, the etching can be carried out in a HDP etcher using an etchant gas that etches the $SiO_2$ layer 14 selectively to the underlying electrically conducting layer 12. More specifically, the preferred etchant gas is $CF_4/CHF_3/Ar$.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a planar insulating layer over a patterned electrically conducting layer on a substrate comprising the steps of:

depositing a conformal first insulating layer having a uniform thickness across said substrate and on said patterned electrically conducting layer;

depositing a conformal etch-stop layer on said first insulating layer;

depositing a second insulating layer composed of silicon oxide on said etch-stop layer sufficiently thick to fill recesses in said patterned electrically conducting layer and thicker than said patterned electrically conducting layer;

partially chemically/mechanically polishing back said second insulating layer and leaving a portion of said second insulating layer over said etch-stop layer to form a global planar surface across said substrate;

blanket plasma etching back the remaining said second insulating layer selectively to said etch-stop layer and replicating said global planar surface without dishing over said patterned electrically conducting layer and thereby completing said planar insulating layer having a uniform thickness on said substrate surface over said patterned electrically conducting layer, and thereby providing a uniform depth for etching said contact openings across said substrate.

2. The method of claim 1, wherein said patterned electrically conducting layer is a conductively doped polysilicon layer, deposited to a thickness of between about 1000 and 3000 Angstroms, and used for electrical interconnections on integrated circuits.

3. The method of claim 1, wherein said patterned electrically conducting layer is a metal layer, deposited to a thickness of between about 1000 and 6000 Angstroms, and used for electrical interconnections on integrated circuits.

4. The method of claim 1, wherein said first insulating layer is silicon oxide, and has a thickness of between about 5000 and 10000 Angstroms.

5. The method of claim 1, wherein said etch-stop layer is silicon nitride, and has a thickness of between about 100 and 500 Angstroms.

6. The method of claim 1, wherein said second insulating layer is deposited to a thickness of between about 5000 and 10000 Angstroms.

7. The method of claim 1, wherein said second insulating layer is a low-dielectric-constant silicon oxide material and is deposited to a thickness of between about 5000 and 10000 Angstroms.

8. The method of claim 1, wherein said second insulating layer is polished back to leave a thickness of between about 1000 and 2000 Angstroms over said etch-stop layer.

9. A method for fabricating a planar insulating layer having contact openings to a patterned electrically conducting layer on a substrate comprising the steps of:

depositing a conformal first insulating layer having a uniform thickness across said substrate and on said patterned electrically conducting layer;

depositing a conformal etch-stop layer on said first insulating layer;

depositing a second insulating layer composed of silicon oxide on said etch-stop layer sufficiently thick to fill recesses in said patterned electrically conducting layer and thicker than said patterned electrically conducting layer;

partially chemically/mechanically polishing back said second insulating layer and leaving a portion of said second insulating layer over said etch-stop layer to form a global planar surface across said substrate;

blanket plasma etching back the remaining said second insulating layer selectively to said etch-stop layer and replicating said global planar surface without dishing over said patterned electrically conducting layer having a uniform thickness on said substrate surface;

etching said contact openings in said etch-stop layer and in said first insulating layer to said patterned electrically conducting layer, wherein said contact openings are etched to a uniform depth across said substrate.

10. The method of claim 9, wherein said patterned electrically conducting layer forms electrical interconnections on integrated circuits.

11. The method of claim 9, wherein said patterned electrically conducting layer has a thickness of between about 1000 and 6000 Angstroms.

12. The method of claim 9, wherein said first insulating layer is silicon oxide, and has a thickness of between about 5000 and 10000 Angstroms.

13. The method of claim 9, wherein said etch-stop layer is silicon nitride, and has a thickness of between about 100 and 500 Angstroms.

14. The method of claim 9, wherein said second insulating layer is deposited to a thickness of between about 5000 and 10000 Angstroms.

15. The method of claim 9, wherein said second insulating layer is a low-dielectric-constant silicon oxide material and is deposited to a thickness of between about 5000 and 10000 Angstroms.

16. The method of claim 9, wherein said second insulating layer is polished back to leave a thickness of between about 1000 and 2000 Angstroms over said etch-stop layer.

17. A method for fabricating a planar insulating layer having contact openings to a patterned electrically conducting layer on a substrate comprising the steps of;

depositing a conformal first insulating layer having a uniform thickness across said substrate and on said patterned electrically conducting layer;

depositing a conformal etch-stop layer on said first insulating layer;

depositing a second insulating layer composed of a low-dielectric-constant material on said etch-stop layer sufficiently thick to fill recesses in said patterned electrically conducting layer and thicker than said patterned electrically conducting layer;

partially chemically/mechanically polishing back said second insulating layer and leaving a portion of said second insulating layer over said etch-stop layer to form a global planar surface across said substrate;

blanket plasma etching back the remaining said second insulating layer selectively to said etch-stop layer and replicating said global planar surface without dishing over said patterned electrically conducting layer;

depositing a third insulating layer having a uniform thickness across said substrate to passivate said low-dielectric material;

etching said contact openings in said third insulating layer, said etch-stop layer, and said first insulating layer to said patterned electrically conducting layer, wherein said contact openings are etched to a uniform depth across said substrate.

18. The method of claim 17, wherein said patterned electrically conducting layer forms electrical interconnections on integrated circuits.

19. The method of claim 17, wherein said patterned electrically conducting layer has a thickness of between about 1000 and 6000 Angstroms.

20. The method of claim 17, wherein said first insulating layer is silicon oxide, and has a thickness of between about 5000 and 10000 Angstroms.

21. The method of claim 17, wherein said etch-stop layer is silicon nitride, and has a thickness of between about 100 and 500 Angstroms.

22. The method of claim 17, wherein said etch-stop layer is a plasma-enhanced silicon oxide, and has a thickness of between about 100 and 500 Angstroms.

23. The method of claim 17, wherein said second insulating layer is deposited to a thickness of between about 5000 and 10000 Angstroms.

24. The method of claim 17, wherein said low-dielectric-constant material is a fluorinated arylene ether polymer.

25. The method of claim 17, wherein said second insulating layer is polished back to leave a thickness of between about 1000 and 2000 Angstroms over said etch-stop layer.

26. The method of claim 17, wherein said third insulating layer is a silicon oxide and is deposited to a thickness of between about 500 and 1000 Angstroms.

27. The method of claim 1, wherein said second insulating layer composed of silicon oxide is blanket plasma etched back using a high-density plasma etcher and an etchant gas of perfluoroisobutylene/carbon monoxide/argon ($C_4F_8$/CO/Ar) to achieve an etch rate selectivity to said etch stop layer greater than 20:1.

28. The method of claim 17, wherein said second insulating layer composed of a low-dielectric-constant material is plasma etched back using an etchant gas of carbon tetrafluoride, trifluoromethane, and argon ($CF_4$/$CHF_3$/Ar) to achieve an etch rate selectivity to said etch stop layer greater than 10:1.

* * * * *